(12) United States Patent
Takamura et al.

(10) Patent No.: US 9,216,660 B2
(45) Date of Patent: Dec. 22, 2015

(54) ELECTRICALLY DRIVEN VEHICLE

(71) Applicant: HONDA MOTOR CO., LTD., Tokyo (JP)

(72) Inventors: Toshiaki Takamura, Wako (JP); Koji Aoki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 185 days.

(21) Appl. No.: 13/971,851

(22) Filed: Aug. 21, 2013

(65) Prior Publication Data

US 2014/0124278 A1  May 8, 2014

(30) Foreign Application Priority Data

Nov. 8, 2012  (JP) ................. 2012-246003

(51) Int. Cl.
| | |
|---|---|
| *B60L 11/18* | (2006.01) |
| *B60K 7/00* | (2006.01) |
| *B60L 15/00* | (2006.01) |
| *H05K 7/20* | (2006.01) |
| *B60K 1/00* | (2006.01) |

(52) U.S. Cl.
CPC ........... *B60L 11/1874* (2013.01); *B60K 7/0007* (2013.01); *B60L 15/007* (2013.01); *H05K 7/20918* (2013.01); *B60K 2001/003* (2013.01); *Y02T 10/648* (2013.01)

(58) Field of Classification Search
CPC .. B60K 7/0007; B60K 1/02; B60K 2001/003; B60K 6/46; B60K 17/356; B60K 11/06; B60L 11/1874

USPC ................. 180/6.48, 6.5, 65.1, 65.51, 65.21, 180/65.22, 65.6, 311, 312; 165/41
See application file for complete search history.

(56) References Cited

U.S. PATENT DOCUMENTS

| | | | | |
|---|---|---|---|---|
| 2,913,223 | A * | 11/1959 | Le Tourneau | 254/327 |
| 3,451,469 | A * | 6/1969 | Hall et al. | 165/41 |
| 4,137,984 | A * | 2/1979 | Jennings et al. | 180/19.1 |
| 4,821,830 | A * | 4/1989 | Tomoda et al. | 180/414 |
| 5,685,798 | A * | 11/1997 | Lutz et al. | 475/331 |
| 5,842,532 | A * | 12/1998 | Fox et al. | 180/6.48 |
| 6,148,940 | A * | 11/2000 | Hokanson et al. | 180/65.51 |
| 6,338,013 | B1 * | 1/2002 | Ruffner | 701/23 |
| 6,717,281 | B1 * | 4/2004 | Brandon et al. | 290/40 C |
| 6,935,453 | B2 * | 8/2005 | Mizuta et al. | 180/235 |
| 7,201,244 | B2 * | 4/2007 | Johnston et al. | 180/65.51 |

(Continued)

FOREIGN PATENT DOCUMENTS

| | | |
|---|---|---|
| JP | 2008-260458 | 10/2008 |
| WO | WO 2006115133 A1 * | 11/2006 |

*Primary Examiner* — Paul N Dickson
*Assistant Examiner* — Bridget Avery
(74) *Attorney, Agent, or Firm* — Mori & Ward, LLP (57) ABSTRACT

An electrically driven vehicle includes a first electric motor, a second electric motor, a first power drive device, a second power drive device, a first heat sink, a second heat sink, a baffle member, a first air guide passage, and a second air guide passage. The baffle member closes a space defined between the first power drive device and the second power drive device at a first end and a second end of the space. The first air guide passage houses the first heat sink. The first air guide passage is provided between a first partition wall and the first power drive device. The second air guide passage houses the second heat sink. The second air guide passage is provided between the first partition wall and the second power drive device.

12 Claims, 9 Drawing Sheets

(56) References Cited

U.S. PATENT DOCUMENTS

| | | | |
|---|---|---|---|
| 7,445,067 B2* | 11/2008 | Marsh et al. | 180/65.51 |
| 7,493,974 B1* | 2/2009 | Boncodin | 180/2.2 |
| 8,028,776 B2* | 10/2011 | Dong et al. | 180/6.48 |
| 8,127,876 B2* | 3/2012 | Phillips | 180/68.2 |
| 2008/0090137 A1* | 4/2008 | Buck et al. | 429/120 |
| 2008/0193830 A1* | 8/2008 | Buck et al. | 429/120 |
| 2008/0248379 A1* | 10/2008 | Takeuchi et al. | 429/120 |
| 2011/0274958 A1* | 11/2011 | Iritani et al. | 429/120 |
| 2014/0124278 A1* | 5/2014 | Takamura et al. | 180/65.51 |

* cited by examiner

ELECTRICALLY DRIVEN VEHICLE

CROSS-REFERENCE TO RELATED APPLICATIONS

The present application claims priority under 35 U.S.C. §119 to Japanese Patent Application No. 2012-246003, filed Nov. 8, 2012. The contents of this application are incorporated herein by reference in their entirety.

BACKGROUND OF THE INVENTION

1. Technical Field

The present invention relates to an electrically driven vehicle.

2. Background Art

This type of electrically driven vehicle is already known in Japanese patent laid-open publication No. 2008-260458, for example. In this electrically driven vehicle, the cooling air drawn in through a cooling fan to be circulated through a battery box in which a plurality of batteries are separately housed is led to cooled sections of a plurality of power drive units so as to cool the power drive units.

SUMMARY OF THE INVENTION

According to one aspect of the present invention, an electrically driven vehicle includes a first electric motor, a second electric motor, a first power drive device, a second power drive device, a first heat sink, a second heat sink, a baffle member, a first air guide passage, and a second air guide passage. The first electric motor is configured to generate motive power to operate a first driving wheel. The second electric motor is configured to generate motive power to operate a second driving wheel. The first power drive device corresponds to the first electric motor and extends in a first direction. The second power drive device corresponds to the second electric motor and extends in the first direction. The first heat sink has a plurality of first cooling fins extending in a second direction orthogonal to the first direction and is attached to a first lateral surface of the first power drive device. The second heat sink has a plurality of second cooling fins extending in the second direction and is attached to a second lateral surface of the second power drive device. The second lateral surface is provided to face the first lateral surface. The baffle member includes a first partition wall which is provided integrally with the baffle member and which is arranged between the first heat sink and the second heat sink. The baffle member closes a space defined between the first power drive device and the second power drive device at a first end and a second end of the space. The first end is opposite to the second end in the first direction. The first air guide passage houses the first heat sink. Cooling air is to flow through the first air guide passage in the second direction. The first air guide passage is provided between the first partition wall and the first power drive device. The second air guide passage houses the second heat sink. Cooling air is to flow through the second air guide passage in the second direction. The second air guide passage is provided between the first partition wall and the second power drive device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

In the following description, the orientation such as front, rear, left, right, upper and lower is set on the basis of a rider riding on an electrically driven vehicle.

Figure 1:
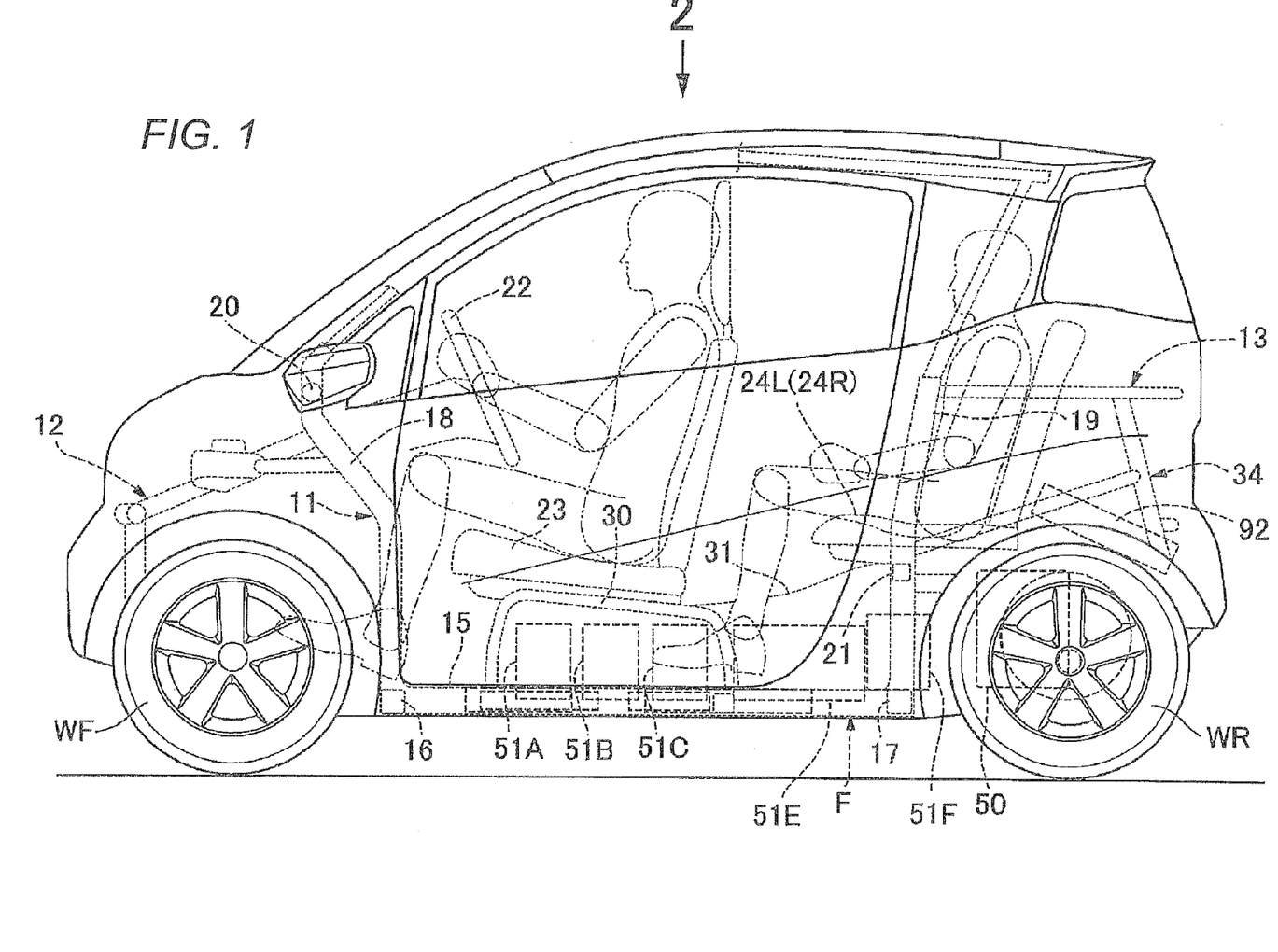
FIG. 1 is a side view of an electrically driven vehicle.
Figure 2:
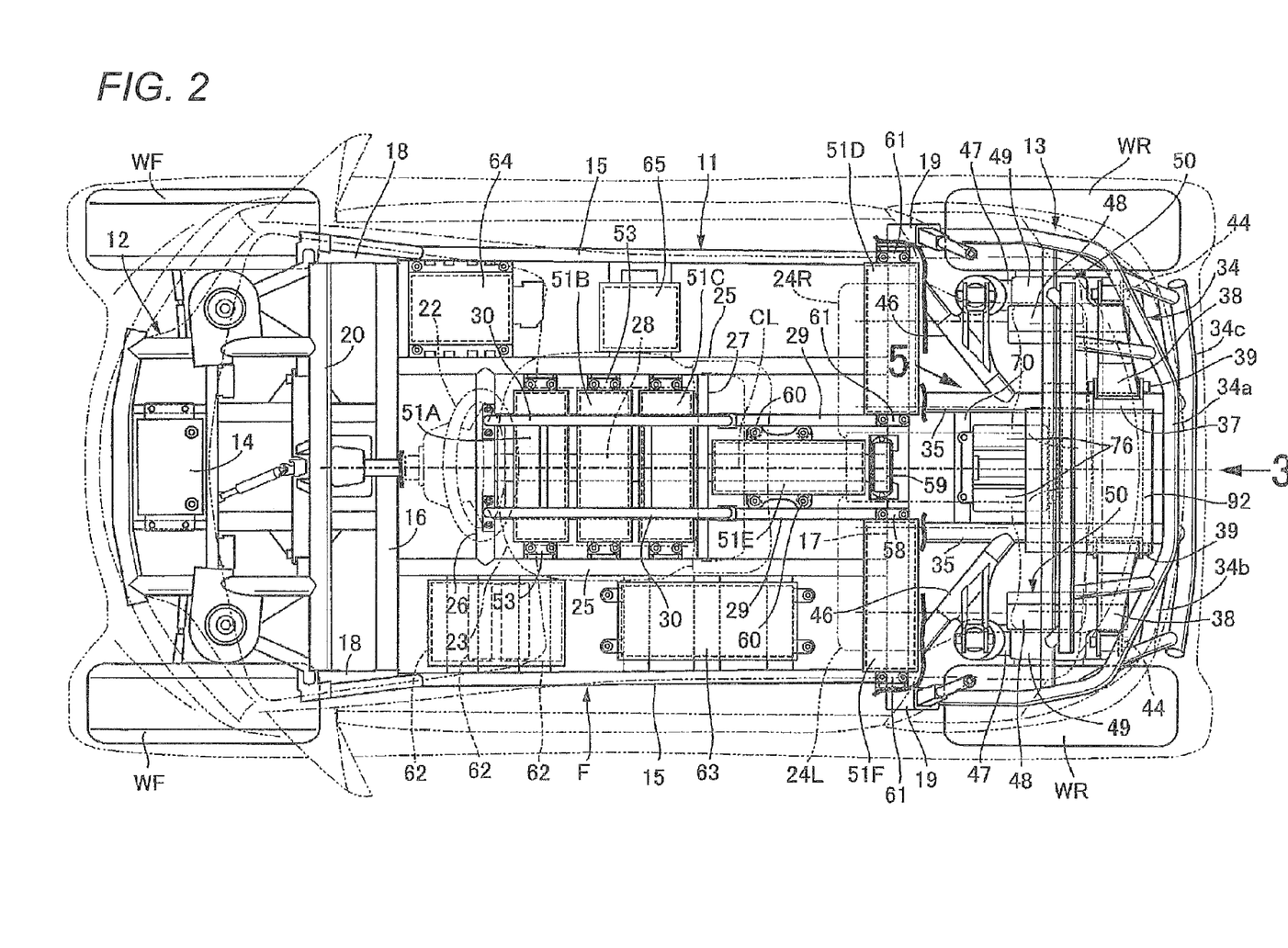
FIG. 2 is a view of a vehicle body frame provided with electrical equipment, viewed from the direction of an arrow 2 of FIG. 1.

Referring first to FIGS. 1 and 2, from a front portion of an electrically driven four-wheeled vehicle as an electrically driven vehicle there are suspended a pair of left and right front wheels WF, WF, and from a rear portion of a vehicle body frame F there are suspended a pair of rear wheels WR, WR.

The vehicle body frame F includes a cabin structure section 11, a front frame 12 connected to a front part of the cabin structure section 11 such as to allow the pair of left and right front wheels WF, WF to be suspended therefrom, and a rear frame 13 connected to a rear part of the cabin structure section 11 such as to allow the pair of left and right rear wheels WR, WR to be suspended therefrom. On the front frame 12 there is mounted a battery 14 for accessories for supplying electric power to the accessories provided on the electrically driven vehicle.

The cabin structure section 11 includes a pair of left and right side sills 15, 15 extending in a forward and backward direction, a front cross frame 16 connecting front portions of the side sills 15, 15, a rear cross frame 17 connecting rear portions of the side sills 15, 15, a pair of left and right front upper frames 18, 18 extending upwardly from the front portions of the side sills 15, 15, a pair of left and right rear upper frames 19, 19 extending upwardly from the rear portions of the side sills 15, 15, a front upper cross frame 20 connecting upper portions of the pair of left and right front upper frames 18, 18, and a rear upper cross frame 21 connecting intermediate portions of the pair of left and right rear upper frames 19, 19.

In a cabin the contour of which is defined by the cabin structure section 11, a driver's seat 23 is arranged at the rear of a steering wheel 22 for steering the front wheels WF, WF and located on a center line CL of the vehicle body which extends forwardly and backwardly along the center of the vehicle body in the vehicle width direction. A pair of left and right rear seats 24L, 24R provided side by side are arranged at the rear of the driver's seat 23.

Between the front cross frame 16 and the rear cross frame 17 there are provided center sub-frames 25, 25 each of which extends in a forward and backward direction on both left and right sides of the center line CL of the vehicle body so as to establish a connection between intermediate portions of the cross frames 16, 17. Front and rear sub-cross frames 26, 27 are provided between the center sub-frames 25, 25 in such a manner as to be spaced apart in the forward and backward direction. A battery support plate 28 arranged on the center line CL of the vehicle body is provided to establish a connection between the front cross frame 16 and the rear cross frame 17. In addition, a pair of left and right battery support frames 29, 29 are arrange on each side of the battery support plate 28 so as to extend in the forward and backward direction. These battery support frames 29, 29 are located between the rear sub-cross frame 27 and the rear cross frame 17.

A pair of left and right seat frames 30, 30 are arranged above the center sub-frames 25, 25 and formed in an upwardly rising configuration. The pair of left and right seat frames 30, 30 extend between front portions of the pair of left and right battery support frames 29, 29 and the front sub-cross frame 26. The driver's seat 23 is carried on the seat frames 30, 30.

Further, the pair of left and right rear seats 24L, 24R are supported by the rear upper cross frame 21 which establishes a connection between the intermediate portions of the rear upper frames 19, 19. A center console 31 is arranged between these rear seats 24L, 24R and extends backwardly from the driver's seat 23 so as to cover the battery support frames 29 and 29 from above.

Figure 3:
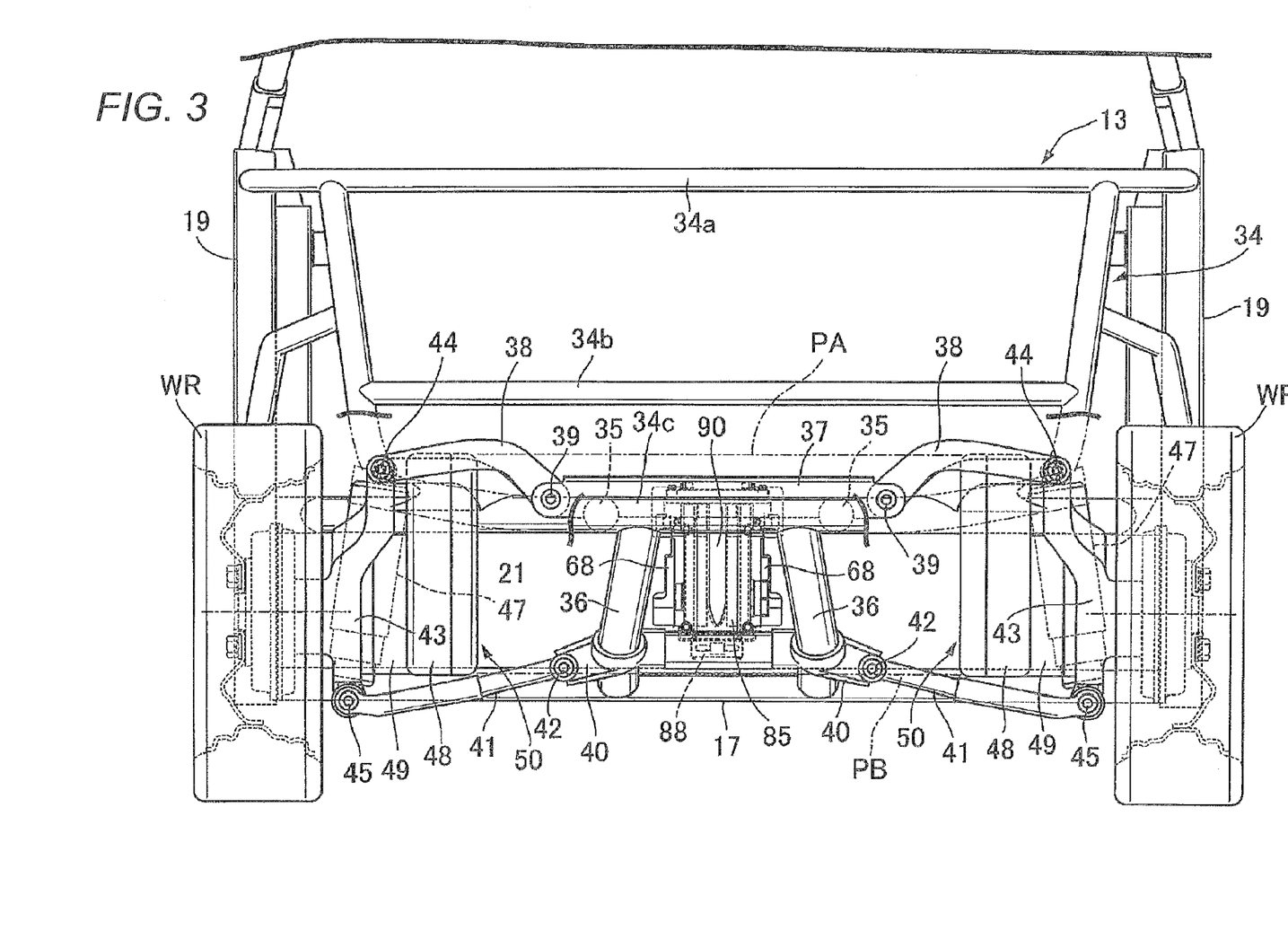
FIG. 3 is a view taken in the direction of an arrow 3 of FIG. 2.

Referring to FIG. 3 together, the rear frame 13 includes a cage frame 34 which defines a contour of the rear part of the vehicle body and which has an upper frame section 34a formed in a backwardly curved shape and connected to upper portions of the rear upper frames 19, 19, an intermediate frame section 34b extending in the vehicle width direction under a rear end of the upper frame section 34a, and a lower frame section 34c extending in the vehicle width direction under the intermediate frame section 34b, a pair of left and right rear upper sub-frames 35, 35 (frame member) extending backwardly from the rear upper cross frame 21 so as to be connected at the rear end thereof to the lower frame section 34c of the cage frame 34, a pair of left and right rear lower sub-frames 36, 36 extending backwardly and upwardly from the rear cross frame 17 so as to be connected at the rear end thereof to the lower frame section 34c, and a rear wheel support frame 37 which is provided between the pair of left and right rear upper sub-frames 35, 35 and extends in the left and right direction.

On each end of the rear wheel support frame 37, inner end portions of a pair of leftward and rightward extending left and right upper suspension arms 38, 38 (suspension arm) are pivotally supported through pins 39, 39 in an upwardly and downwardly swingable fashion. On brackets 40, 40 each provided on the rear portions of the pair of left and right rear lower sub-frames 36, 36, inner end portions of a pair of leftward and rightward extending left and right lower suspension arms 41, 41 are pivotally supported through pins 42, 42 in an upwardly and downwardly swingable fashion. Moreover, upper portions of knuckles 43, 43 for having the rear wheel WR pivotally supported thereon are connected through pins 44, 44 to outer end portions of the upper suspension arms 38, 38, while lower portions of the knuckles 43, 43 are connected through pins 45, 45 to outer end portions of the lower suspension arms 41, 41. In addition, a pair of left and right cushion support frames 46, 46 are provided between the intermediate portions of the rear upper sub-frames 35, 35 and the rear upper cross frame 21. On the pair of left and right cushion support frames 46, 46, there are supported upper end portions of a pair of upwardly and downwardly extending left and right rear cushions 47, 47. Lower end portions of these rear cushions 47, 47 are connected to the pair of left and right knuckles 43, 43.

The pair of left and right rear wheels WR, WR are driven by motive power created by electric motors 48, 48 provided separately corresponding to these rear wheels WR, WR. Driving units 50, 50 constructed by having the electric motors 48, 48 attached to reduction gear casings 49, 49 which house reduction gears for reducing the rotational power from the electric motors 48, 48 thereby to transmit the same to the rear wheels WR, WR, are mounted on the knuckles 43, 43.

Referring again to FIG. 2, this electrically driven vehicle is equipped with a plurality of batteries in order to supply the electric power to the pair of left and right electric motors 48, 48. The electrically driven vehicle of this embodiment is a small-sized one, and it is not required that the distance capable of traveling on a single charge is equal to the distance that the normal four-wheeled electrically driven vehicle capable of being equipped with a large amount of batteries is able to travel on a single charge. Therefore, a capacity of batteries to be loaded, namely, the number of batteries is comparatively small, and small space is enough for the arrangement of these batteries. Accordingly, six batteries of from first to sixth batteries 51A, 51B, 51C, 51D, 51E, 51F are loaded into the electrically driven vehicle in such a manner as to be connected in series. Each of the batteries 51A~51F is formed in the shape of a rectangular parallelepiped having a rectangular cross section.

Figure 4:
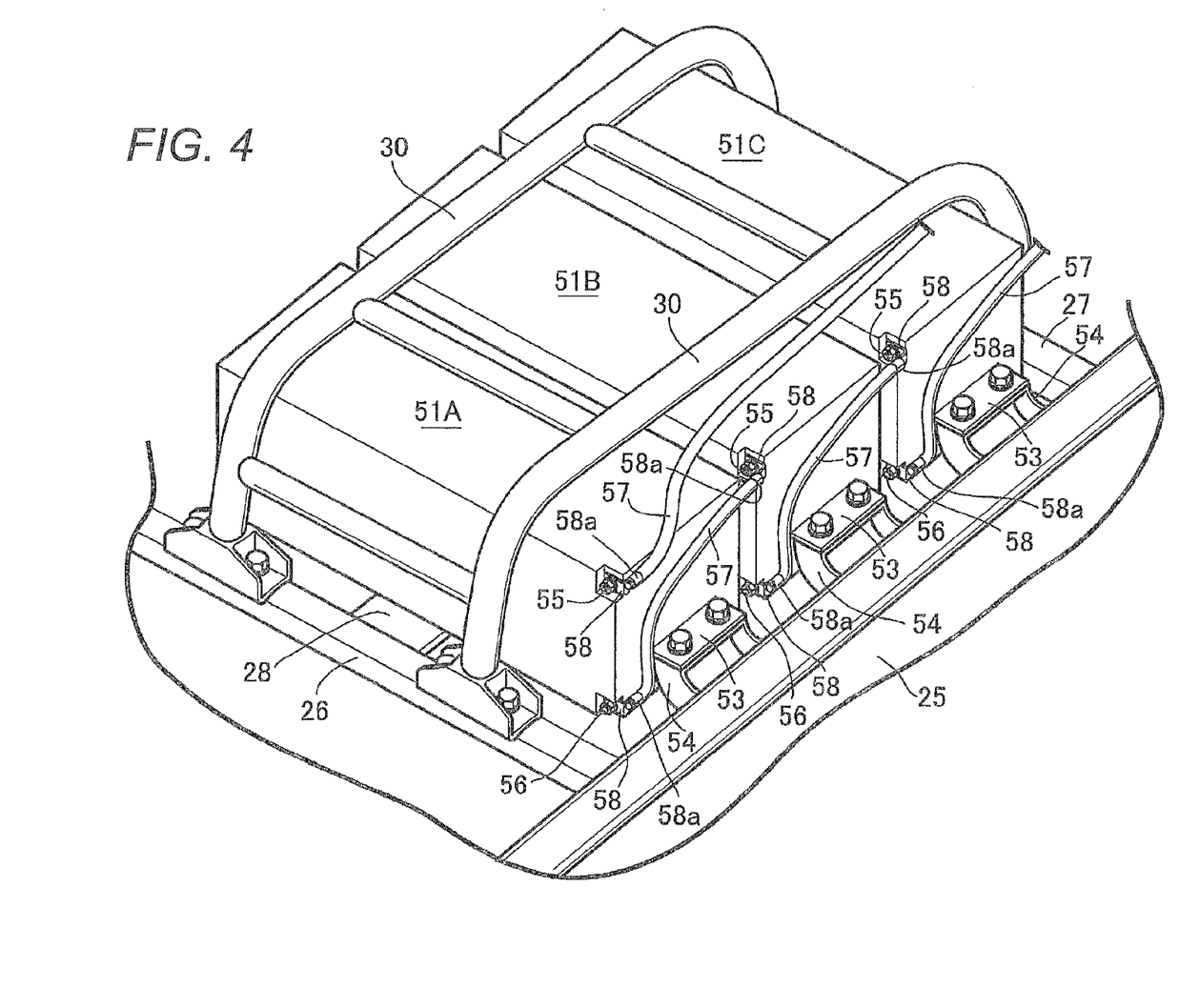
FIG. 4 is a perspective view of batteries arranged under a driver's seat.
Figure 5:
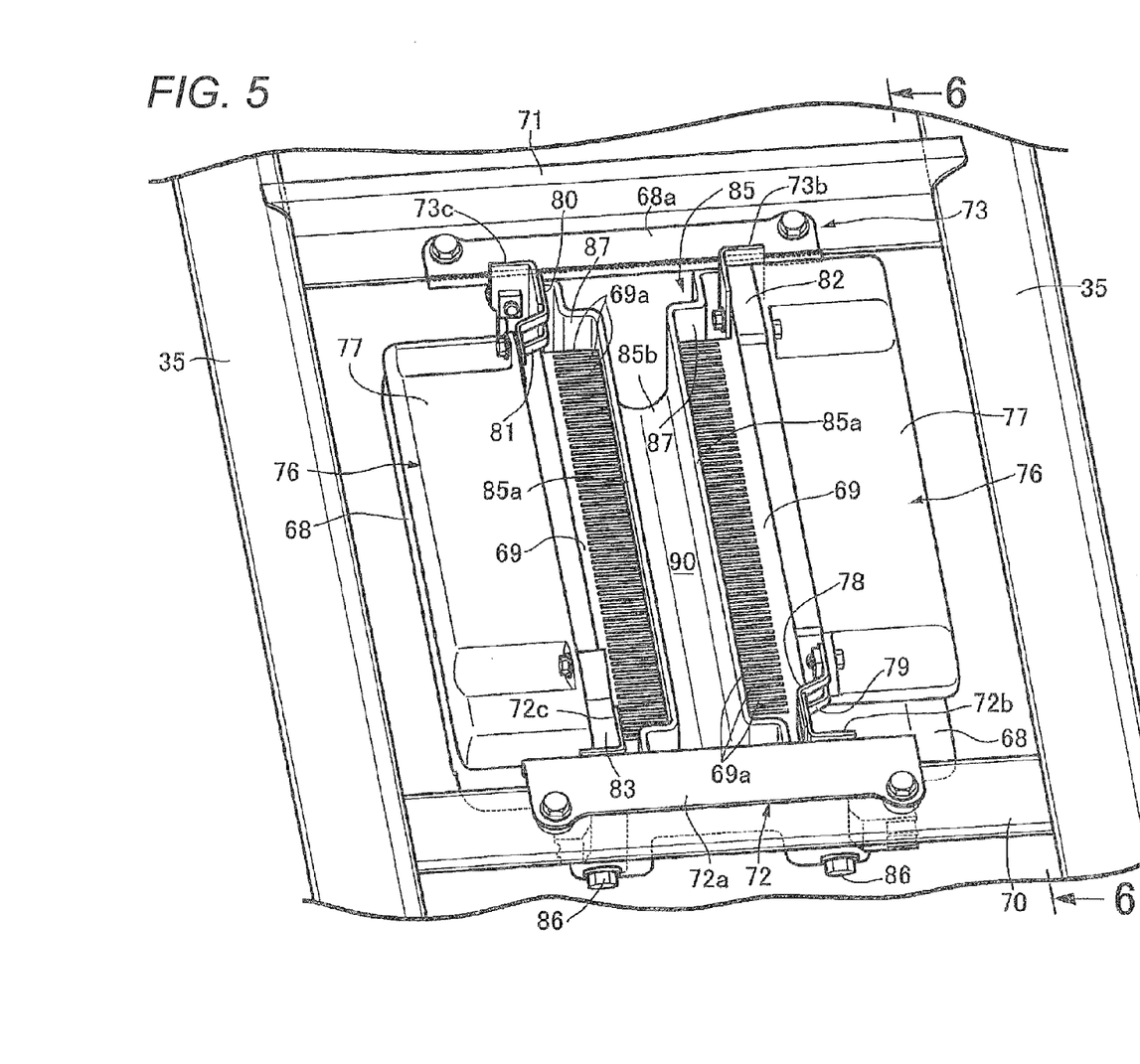
FIG. 5 is a view of a power drive unit and a heat sink, viewed from the direction of an arrow 5 of FIG. 2.
Figure 6:
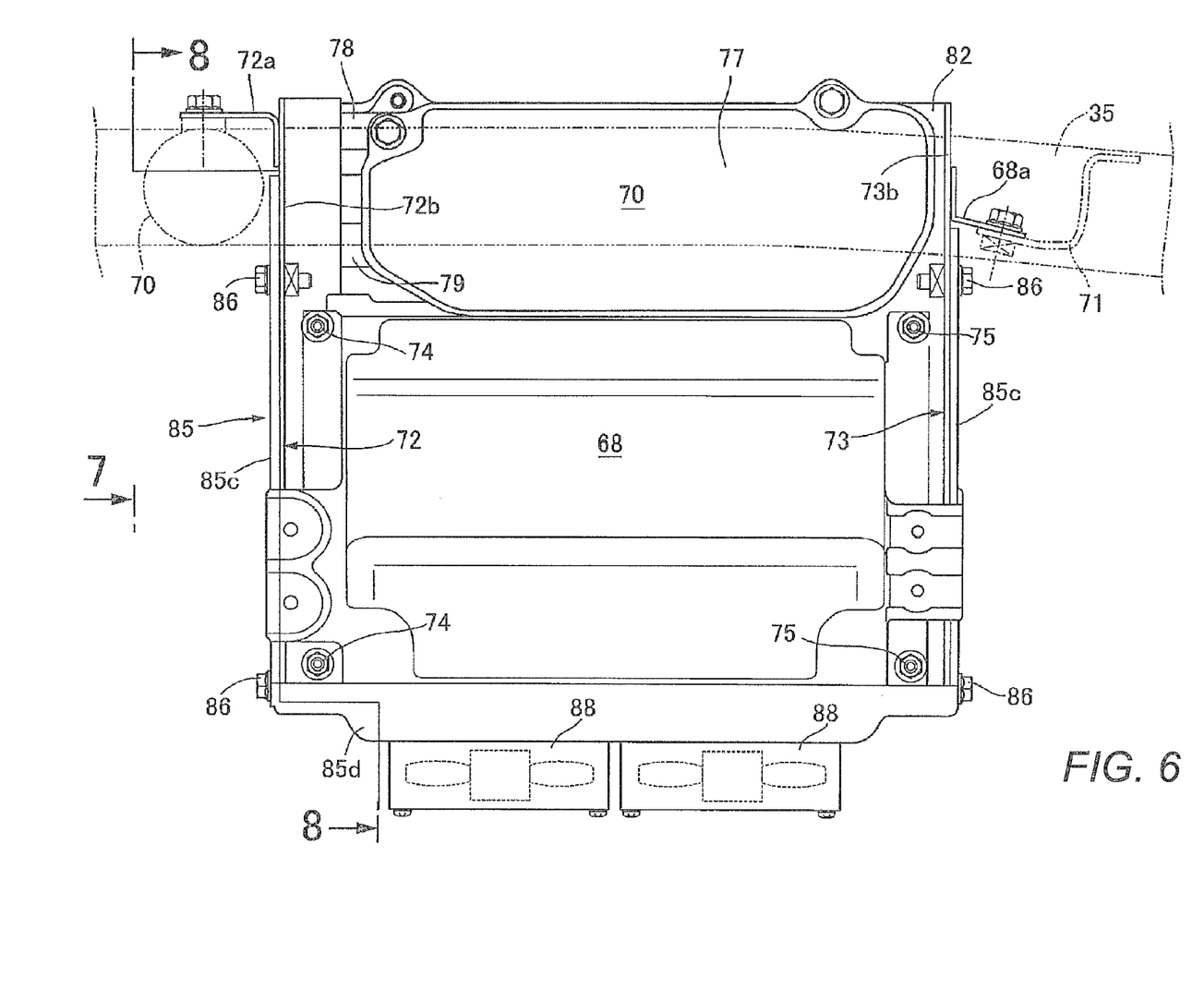
FIG. 6 is a view taken in the direction of arrows along line 6-6 of FIG. 5.
Figure 7:
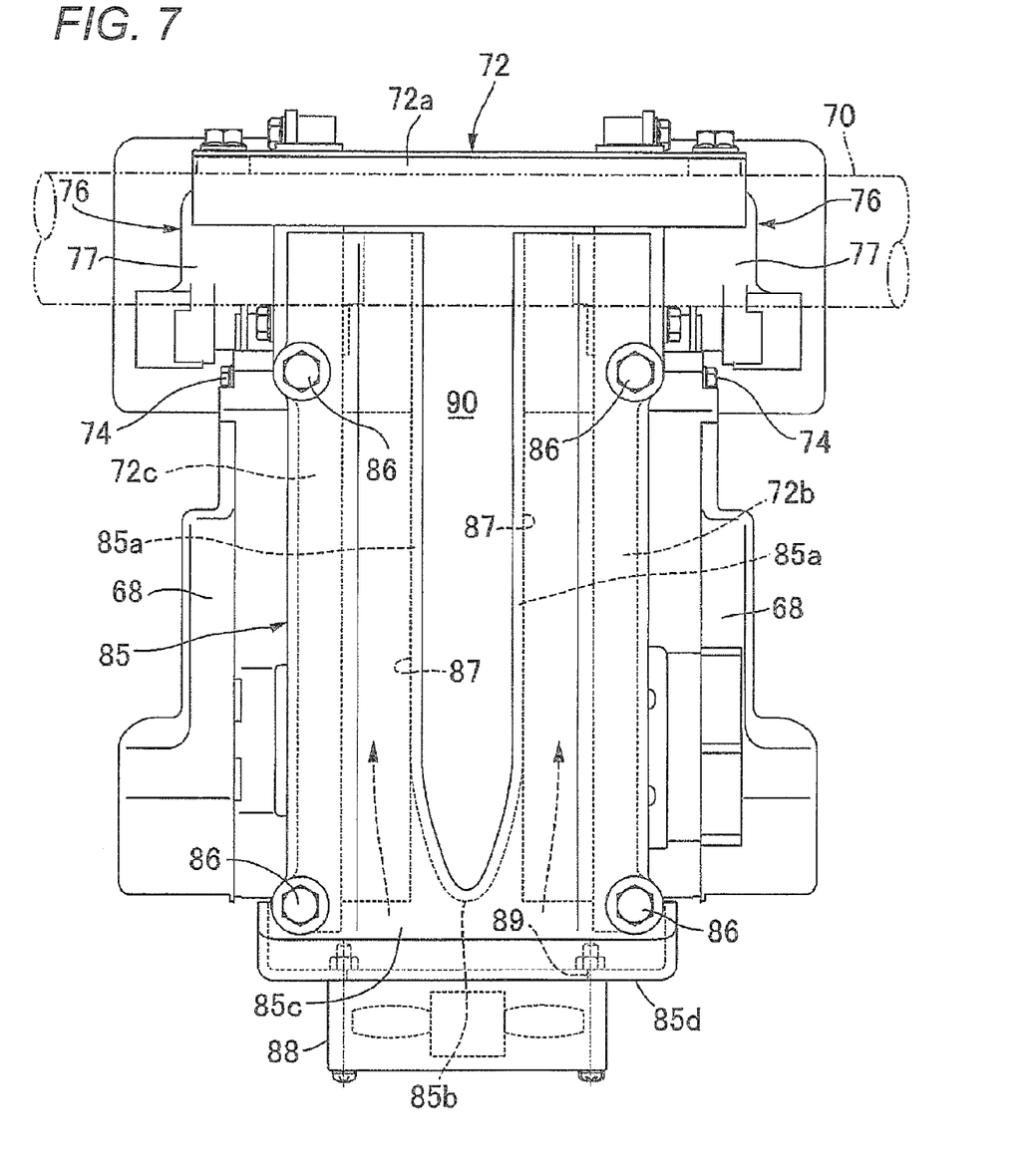
FIG. 7 is a view taken in the direction of an arrow 7 of FIG. 6.
Figure 8:
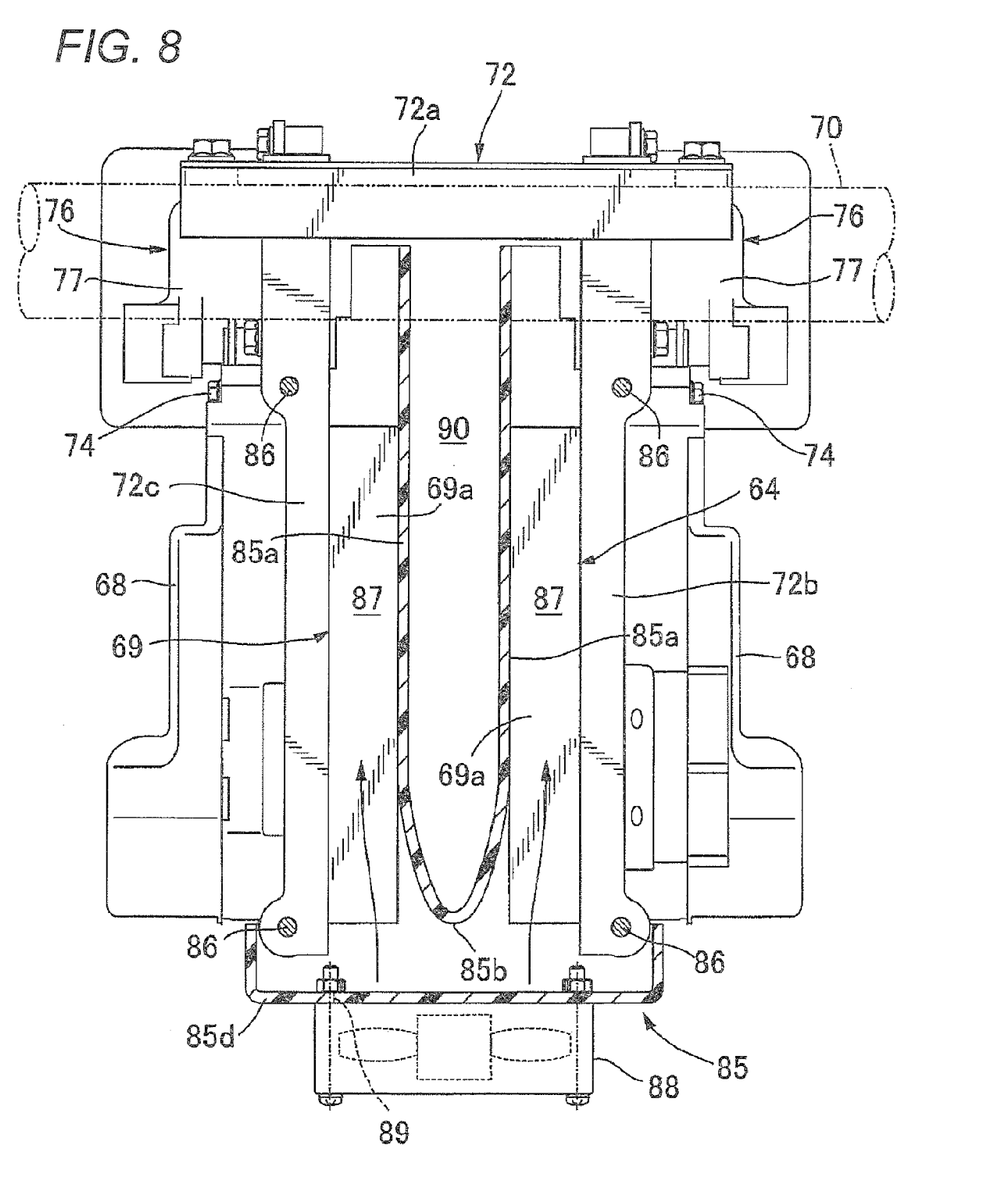
FIG. 8 is a cross sectional view taken along line 8-8 of FIG. 6.

Referring to FIG. 4 together, the first to third batteries 51A~51C among the first to sixth batteries 51A~51F are arranged and aligned under the driver's seat 23 one behind another in a forward and backward direction such that longitudinal directions thereof extend in the vehicle width direction. Also, the first to third batteries 51A~51C are arranged between the pair of left and right center sub-frames 25, 25 such as to place the central portion in the longitudinal direction thereof on the battery support plate 28. Support plates 53, 53 . . . provided on both ends in the longitudinal direction of each of the batteries 51A~51C are fastened to stays 54, 54 . . . provided on the center sub-frames 25, 25 in the corresponding relationship to the first to third batteries 51A~51C.

Further, positive side terminals 55, 55, 55 and negative side terminals 56, 56, 56 are provided at one end in the longitudinal direction of each of the first to third batteries 51A~51C and on an upper portion and a lower portion of each front surface of these batteries. Connecting terminals 58, 58 . . . to which conducting wires 57, 57 . . . are attached respectively are electrically connected to the positive side terminals 55, 55, 55 and the negative side terminals 56, 56, 56 respectively. Each of the connecting terminals 58, 58 . . . is configured to have a conducting wire connecting portion 58a, 58a . . . which projects in the lateral direction of each of the batteries 51A~51C. The conducting wire connecting portions 58a, 58a . . . are formed in a circular shape to allow the ends of the conducting wires 57, 57 to be attached thereto such that ends of each of the conducting wires 57, 57 . . . are inserted into and caulked with the conducting wire connecting portions 58a, 58a . . . .

Further, the fourth to sixth batteries 51D~51F among the first to sixth batteries 51A~51F, excluding the first to third batteries 51A~51C located under the driver's seat 23, are arranged only under the center console 31 and under the pair of left and right rear seats 24L, 24R at the rear of the driver's seat 23 such that the fifth and sixth batteries 51E, 51F are connected in this order in series with the fourth battery 51D which is connected in series with the third battery 51C. The fourth battery 51D is arranged under the right side rear seat 24R in such a manner that the longitudinal direction thereof extends in the vehicle width direction. The fifth battery 51E is arranged under the center console 31 in such a manner that the longitudinal direction thereof extends in the forward and backward direction. The sixth battery 51F is arranged under the left side rear seat 24L in such a manner that the longitudinal direction thereof extends in the vehicle width direction. In addition, between both of the rear seats 24L, 24R, there is placed a service plug 59 which is interposed midway in a circuit connecting the third and fourth batteries 51C, 51D.

The fifth battery 51E is arranged between the pair of left and right battery support frames 29, 29 such as to be placed on the battery support plate 28. Support plates 60, 60 provided on each of left and right lower sides of the fifth battery 51E are fastened to stays (not shown) which are arranged in pairs on the battery support frames 29, 29 while leaving a space in the forward and backward direction.

The fourth and sixth batteries 51D, 51F arranged each under the pair of left and right rear seats 24L, 24R are located between the rear cross frame 17 and the rear upper cross frame 21 so as to be mounted on the rear cross frame 17 with the longitudinal directions thereof extending along the rear cross frame 17.

Moreover, support plates 61, 61 provided on both ends in the longitudinal direction of each of the fourth and sixth batteries 51D, 51F are fastened to stays (not shown) provided on the rear cross frame 17.

By the way, although the driver's seat 23 is arranged on the center line CL of the vehicle body, three DC-DC converters 62, 62, 62 and a main contactor 63 as high voltage electrical equipment are arranged on one side (left side in this embodiment) of left and right sides of the center line CL of the vehicle body, while an ECU 64 for controlling the vehicle and an ECU 65 for controlling the motor, as low voltage electrical equipment, are arranged on the other (right side in this embodiment) of the left and right sides of the center line CL of the vehicle body.

By the way, the reason why these three DC-DC converters 62 are employed is because in the case of a single DC-DC converter 62, the efficiency is decreased in a region where output power is low. Therefore, in order to improve the efficiency, the three DC-DC converters 62 . . . are connected in parallel and the number to be used is varied in proportion to the load.

Referring to FIGS. 5 through 8 together, a pair of power drive units 68, 68 corresponding individually to the pair of electric motors 48, 48 are arranged in parallel in a plan view between the pair of rear upper sub-frames 35, 35 of the rear frame 13 and, as shown in FIG. 3, located between a horizontal plane PA passing through upper ends of the pair of driving units 50, 50 and a horizontal plane PB passing through lower ends of the driving units 50, 50.

On lateral surfaces of mutually opposed sides of the power drive units 68, 68, there are separately mounted heat sinks 69, 69 each of which has a plurality of cooling fins 69a, 69a, 69a . . . extending in parallel in the direction orthogonal to the direction of parallel arrangement of the power drive units 68, 68, namely, in the upper and lower direction in this embodiment.

A front support frame 70 and a rear support frame 71 are positioned on each side in the forward and backward direction of the power drive units 68, 68 and between the pair of rear upper sub-frames 35, 35 in a plan view. A front support mount 72 is attached to the front support frame 70, while a rear support mount 73 is attached to the rear support frame 71.

The front support mount 72 includes a front horizontal frame 72a which extends in the vehicle width direction to be fastened to the front support frame 70, and a pair of downwardly extending left and right front vertical frames 72b, 72c which are attached to the front horizontal frame 72a at two positions spaced apart in the vehicle width direction. The rear support mount 73 includes a rear horizontal frame 73a which extends in the vehicle width direction to be fastened to the rear support frame 71, and a pair of downwardly extending left and right rear vertical frames 73b, 73c which are attached to the rear horizontal frame 73a at two positions spaced apart in the vehicle width direction. The front horizontal frame 72a, the front vertical frames 72b, 72c, the rear horizontal frame 73a and the rear vertical frames 73b, 73c are made of shape steel of an L-shaped cross section.

The front lateral walls of the pair of left and right power drive units 68, 68 are fastened through bolts 74, 74 to an upper portion and a lower portion of each of the pair of the left and right front vertical frames 72b, 72c provided on the front support mount 72, while the rear lateral walls of the pair of left and right power drive units 68, 68 are fastened through bolts 75, 75 to an upper portion and a lower portion of each of the pair of the left and right rear vertical frames 73b, 73c provided on the rear support mount 73.

Further, current sensors 76, 76 are arranged above the power drive units 68, 68, respectively. A front portion of a casing 77 of the left side current sensor 76 is fastened to a pair of upper and lower support stays 78, 79 which are located on an upper part of the left side front vertical frame 72b provided on the front support mount 72. A rear portion of a casing 77 of the right side current sensor 76 is fastened to a pair of upper and lower support stays 80, 81 which are located on an upper part of the right side rear vertical frame 73c provided on the rear support mount 73.

In addition, a rear portion of the casing 77 of the left side current sensor 76 is fastened to a support stay 82 which is located on an upper part of the left side rear vertical frame 73b provided on the rear support mount 73. A front portion of the casing 77 of the right side current sensor 76 is fastened to a support stay 83 which is located on an upper part of the right side front vertical frame 72c provided on the front support mount 72.

To the front vertical frames 72b, 72c of the front support mount 72 and to the rear vertical frames 73b, 73c of the rear support mount 73, there is fastened a baffle member 85 which closes a space between the pair of parallel extending power drive units 68, 68 at both ends in the parallel extending direction of these power drive units 68, 68.

Figure 9:
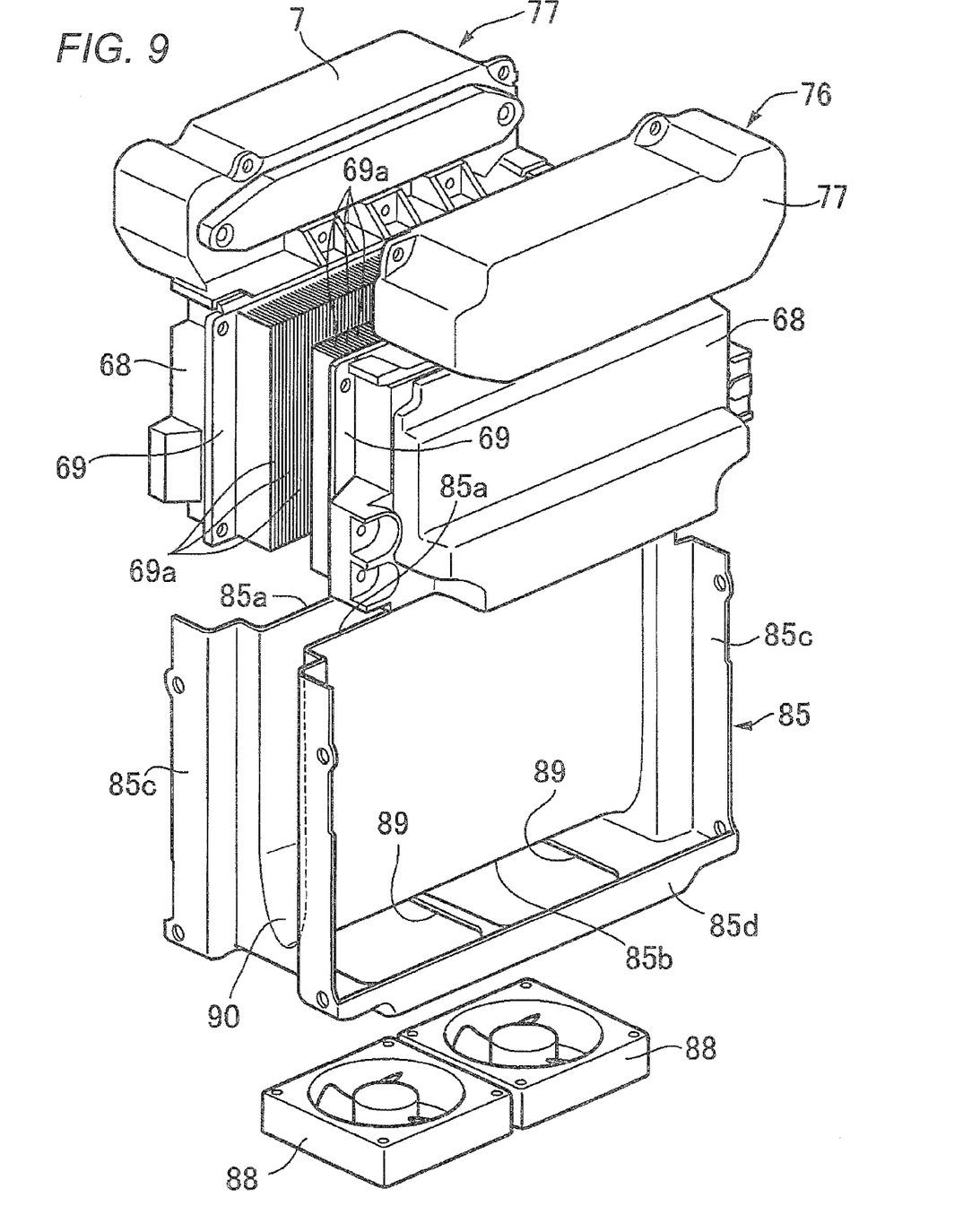
FIG. 9 is an exploded perspective view of the power drive unit to which the heat sink and an electric current sensor are attached, a baffle member and a cooling fan.

Referring to FIG. 9 together, the baffle member 85 is made of synthetic resin and integrally provided with a pair of partition wall sections 85a, 85a which are arranged between the heat sinks 69, 69 attached to the power drive units 68, 68 and lower portions of which are connected to each other, a lower connecting section 85b having a substantially upwardly opened U-shaped cross section so as to connect the lower portions of the partition wall sections 85a, 85a, a pair of front and rear end wall sections 85c, 85c which are connected at right angles to the partition wall sections 85a, 85a and to the lower connecting section 85b at both ends in the parallel extending direction of the power drive units 68, 68, and a bottom wall section 85d arranged under the lower connecting section 85b to connect lower end portions of the end wall sections 85c, 85c. The end wall sections 85c, 85c are fastened through bolts 86, 86 to the front vertical frames 72b, 72c of the front support mount 72 and the rear vertical frames 73b, 73c of the rear support mount 73.

Between the partition wall sections 85a, 85a of the baffle member 85 and the power drive units 68, 68, there are formed a pair of air guide passages 87, 87 through which cooling air flows in the extending direction of each of the cooling fins 69a, 69a provided on the pair of heat sinks 69, 69, namely, in the upward and downward direction in this embodiment and in which the heat sinks 69, 69 are housed individually.

Further, a pair of front and rear cooling fans 88, 88 for blowing the cooling air into the air guide passages 87, 87 through each one end thereof are mounted on the baffle member 85. In this embodiment, since the cooling fins 69a, 69a of the heat sinks 69, 69 within the air guide passages 87, 87 extend in parallel in the upward and downward direction, the cooling fans 88, 88 are mounted on the bottom wall section 85d of the baffle member 85 in such a manner as to circulate the cooling air in the upward direction. Openings 89, 89 are formed individually corresponding to each of the cooling fans 88, 88.

Further, between the partition wall sections 85a, 85a of the baffle member 85 there is formed an air passage 90 which is separated from the air guide passage 87, 87 provided between the partition wall sections 85a, 85a and the power drive units 68, 68. A front end and a rear end of the air passage 90 are opened to center portions in the vehicle width direction of the end wall sections 85c, 85c so as to allow the traveling air to flow therethrough.

Further, on the rear frame 13 there is supported a battery charger 92 for charging the first to sixth batteries 51A~51F from an external power source. The battery charger 92 is located above the current sensors 76, 76.

Next, the operation of this embodiment will be described. Although the first to sixth batteries 51A~51F are loaded onto the electrically driven vehicle provided with the driver's seat 23 and the pair of left and right rear seats 24L, 24R arranged side by side behind the driver's seat 23, the first to third batteries 51A, 51B, 51C among the first to sixth batteries 51A~51F are arranged under the driver's seat 23, and the fourth to sixth batteries 51D~51F as the remaining batteries are arranged only under the center console 31 which extends backwardly from the drier's seat 23 and is located between the pair of left and right rear seats 24L, 24R, and under the pair of left and right rear seats 24L, 24R in the rear of the driver's seat 23. Accordingly, the floor surface forwardly of each of the rear seats 24L, 24R does not rise due to the arrangement of the fourth to sixth batteries 51D, 51E, 51F, so that the footrest of the passengers sitting in the rear seats 24L, 24R is prevented from being heightened due to the arrangement of the fourth to sixth batteries 51D, 51E, 51F and it is possible to ensure the cabin space.

Further, the vehicle body frame F includes the pair of left and right side sills 15, 15, the front and rear cross frames 16, 17 connecting the front portions and the rear portions of the side sills 15, 15 respectively, the pair of left and right rear upper frames 19, 19 extending upwardly from the rear portions of the side sills 15, 15, and the rear upper cross frame 21 connecting the intermediate portions of the rear upper frames 19, 19 so as to support the pair of left and right rear seats 24L, 24R. Moreover, the fourth and sixth batteries 51D, 51F each arranged under the rear seats 24L, 24R are located between the rear cross frame 17 and the rear upper cross frame 21. Accordingly, the fourth and sixth batteries 51D, 51F under the rear seats 24L, 24R can be located in such a position as not to exert an influence on the cabin space. In addition, since the rear upper cross frame 21 and the rear cross frame 17 each of which is a rigid body are arranged above and below the fourth and sixth batteries 51D, 51F, it is possible to protect the fourth and sixth batteries 51D, 51F.

Further, since the fourth and sixth batteries 51D, 51F arranged under the rear seats 24L, 24R are formed in the shape of a rectangular parallelepiped a longitudinal direction of which extends along the rear cross frame 17, the fourth and sixth batteries 51D, 51F can be prevented from projecting to the cabin space.

The first to third batteries 51A, 51B, 51C are arranged under the driver's seat 23 one behind another in the forward and backward direction, and the connecting terminals 58 . . . which have the conducting wire connecting portions 58a . . . projecting in the lateral direction of each of these batteries 51A~51C are electrically connected to the terminals 55, 55 . . . ; 56, 56 . . . of the batteries 51A~51C. In addition, the ends of the conducting wires 57 . . . are attached to the conducting wire connecting portions 58a . . . at the lateral sides of the first to third batteries 51A~51C. Accordingly, the conducting wire connecting portions 58a . . . are able to be oriented to any direction desired to extend the conducting wires 57 . . . , whereby to establish electrical connections between the first to third batteries 51A~51C without causing protrusion by bending the conducting wires 57 . . . on the lateral sides of the first to third batteries 51A~51C aligned in the forward and backward direction.

Further, the driver's seat 23 is arranged on the center line CL of the vehicle body which passes through the vehicle center in the vehicle width direction to extend in the forward and backward direction. The DC-DC converter 62, 62, 62 and the main contactor 63 as the high voltage electrical equipment are arranged on one side (left side in this embodiment) of the left and right sides of the vehicle body center line CL while the ECU 64 for controlling the vehicle and the ECU 65 for controlling the motor, as the low voltage electrical equipment, are arranged on the other (right side in this embodiment) of the left and right sides of the vehicle body center line CL. Therefore, the effective wiring with good space efficiency can be provided.

Further, the pair of power drive units 68, 68 provided individually corresponding to the pair of electric motors 48, 48 which generate the motive power for driving the left and right rear wheels WR, WR are arranged in parallel between the rear wheels WR, WR. On the lateral surfaces of the mutually opposed sides of the power drive units 68, 68, there are separately mounted the heat sinks 69, 69 each of which has the plurality of cooling fins 69a, 69a . . . extending in parallel in the direction orthogonal to the parallel extending direction of the power drive units 68, 68. In addition, between the pair of power drive units 68, 68 and the partition wall sections 85a, 85a integrally formed on the baffle member 85 which closes the space between the power drive units 68, 68 at both ends in the parallel extending direction, there are formed the pair of air guide passages 87, 87 which house the heat sinks 69, 69 separately in such a manner as to allow the cooling air to flow in the extending direction of each of the cooling fins 69a, 69a . . . . Accordingly, the cooling air can be surely circulated toward the each of the heat sinks 69, 69 whereby to carry out the secure cooling, and the pair of air guide passages 87, 87 can be formed between the power drive units 68, 68 by a single baffle member 85 with good space efficiency. Moreover, since the partition wall sections 85a, 85a are located between the pair of air guide passages 87, 87, it is possible to restrain the thermal influence from one of the heat sinks 69, 69 from operating on the other.

Further, since the cooling fans 88, 88 for blowing the cooling air into the air guide passages 87, 87 through each one end thereof are mounted on the baffle member 85, each of the heat sinks 69, 69 can be more effectively cooled due to forced cooling by the cooling fans 88, 88.

In addition, since the pair of partition wall sections 85a, 85a are integrally formed on the baffle member 85 in such a manner that the air passage 90 is formed independently of the pair of air guide passages 87, 87 between the pair of partition wall sections 85a, 85a, the partition wall sections 85a, 85a can be cooled by the air flowing through the air passage 90, and the mutual thermal influence between the heat sinks 69, 69 can be restrained more effectively.

Further, since the cooling fans 88, 88 are mounted on the lower end of the baffle member 85 such that the cooling air flows upwardly within the pair of air guide passages 87, 87 which house individually the pair of heat sinks 69, 69 having the plurality of cooling fins 69a, 69a extending in parallel in the upward and downward direction, the cooling air blown through the cooling fans 88, 88 flows upwardly within the pair of air guide passages 87, 87 which house the pair of heat sinks 69, 69 individually, so that, in cooperation with the heated air circulating upwardly by convection, the cooling air from the cooling fans 88, 88 can be circulated more effectively within the air guide passages 87, 87 whereby to carry out more effective cooling.

Further, the vehicle body frame F is provided with the cabin structure section 11, and the pair of left and right rear upper sub-frames 35, 35 extending backwardly from the cabin structure section 11. The upper suspension arms 38, 38 which extend laterally outwardly so as to have the rear wheels WR, WR suspended therefrom are swingably supported on each end of the rear wheel support frame 37 which is fixedly secured to the pair of rear upper sub-frames 35, 35 to extend in the vehicle width direction. Moreover, the pair of power drive units 68, 68 are arranged between the pair of rear upper sub-frames 35, 35 in plan view. Accordingly, by the construction that the heat sinks 69, 69 are attached individually to each of the lateral surfaces of the mutually opposed sides respectively, the pair of power drive units 68, 68 can be compactly arranged in the area corresponding to the narrow space in the vehicle width direction between the rear upper sub-frames 35, 35.

Furthermore, the pair of driving units 50, 50 including the electric motors 48, 48 respectively are supported on the knuckles 43, 43 for pivotally supporting the rear wheels WR, WR, and the pair of power drive units 68, 68 are arranged between the horizontal planes PA, PB which extend through the upper ends and the lower ends of the driving units 50, 50. Accordingly, the pair of power drive units 68, 68 can be arranged more compactly.

While the embodiment of the present invention has been described, it is to be understood that the present invention is not limited to the above described embodiment, and that various changes and modifications in design may be made without departing from the scope of the present invention delineated by the following claims.

According to a first aspect of the embodiment, there is provided an electrically driven vehicle which includes a pair of electric motors for generating motive power to operate a driving wheel, a pair of power drive units provided individually corresponding to these electric motors, wherein the pair of power drive units extend in parallel, a pair of heat sinks which have a plurality of cooling fins extending in parallel with the direction orthogonal to the parallel extending direction of the power drive units and which are attached individually to lateral surfaces on mutually opposed sides of the pair of power drive units respectively, a partition wall section which is formed integral with a baffle member closing a space between the pair of power drive units at both ends in the parallel extending direction and which is arranged between the pair of heat sinks, and a pair of air guide passages which house the heat sinks individually therein so as to circulate cooling air in the extending direction of the cooling fins, wherein the pair of air guide passages are formed between the partition wall section and the pair of power drive units.

According to a second aspect of the embodiment, in addition to the first aspect, there is provided a cooling fan for blowing the cooling air into the air guide passages through each one end thereof, being mounted on the baffle member.

According to a third aspect of the embodiment, in addition to the first or second aspect, a pair of partition wall sections are formed integral with the baffle member such that an air passage provided independently of the pair of air guide passages is formed between the pair of partition wall sections.

According to a fourth aspect of the embodiment, in addition to the second aspect, the cooling fan is mounted on a lower end of the baffle member to circulate the cooling air upwardly within the pair of air guide passages which house individually the pair of heat sinks having the plurality of cooling fins extending in parallel in the upward and downward direction.

According to a fifth aspect of the embodiment, in addition to any of the first through fourth aspects, a vehicle body frame includes a cabin structure section and a pair of left and right frame members extending backwardly from the cabin structure section, a pair of suspension arms which extend outwardly so as to allow the left and right rear wheels as a driving wheel to be suspended therefrom are swingably supported each on both ends of a rear wheel support frame which is fixedly secured to the pair of frame members and extends in the vehicle width direction, and the pair of power drive units are arranged between the pair of frame members in a plan view.

According to a sixth aspect of the embodiment, in addition to the fifth aspect, a pair of driving units including the electric motors are supported on a knuckle on which the rear wheel is pivotally supported, and the pair of power drive units are arranged between horizontal planes passing through upper ends and lower ends of the driving units.

According to the first aspect of the embodiment, since the heat sinks having the plurality of parallel extending cooling fins and attached individually to the pair of power drive units are housed individually within the pair of air guide passages which circulate the cooling air in the extending direction of the cooling fins, the cooling air can be surely circulated to each of the heat sinks so as to perform secure cooling. Moreover, the heat sinks are attached individually to the lateral surfaces on the mutually opposed sides of the pair of parallel extending power drive units respectively, and the air guide passages are formed each between the pair of power drive units and the partition wall section formed integral with the baffle member which closes the space between the pair of power drive units at both ends in the parallel extending direction thereof, whereby the pair of air guide passages can be effectively formed by a single baffle member between both of the power drive units. In addition, since the partition wall section is interposed between the pair of air guide passages, it is possible to restrain the thermal influence from one of the heat sinks from being exerted on the other thereof.

According to the second aspect of the embodiment, since the cooling air is blown into the air guide passages by the cooling fan, each of the heat sinks can be cooled more effectively through the forced cooling by the cooling fan.

According to the third aspect of the embodiment, since the pair of partition wall sections are integrally formed on the baffle member, and the air passage independent of the pair of air guide passages is formed between both of the partition wall sections, the partition wall sections can be cooled with air flowing through the air passage, and the mutual thermal influence between the heat sinks can be restrained more effectively.

According to the fourth aspect of the embodiment, the cooling fins of the pair of heat sinks extend in parallel in the upward and downward direction, and the cooling air blown through the cooling fan mounted on the lower end of the baffle member flows upwardly within the pair of air guide passages which house the pair of heat sinks individually, so that, in cooperation with the heated air circulated upwardly by convection, the cooling air from the cooling fans can be more effectively circulated within the air guide passages whereby to carry out more effective cooling.

According to the fifth aspect of the embodiment, the pair of suspension arms which allow the left and right rear wheels to be suspended therefrom are swingably supported on both ends of the rear wheel support frame which is fixedly secured to the pair of left and right frame members extending backwardly from the cabin structure section of the vehicle body frame and extends in the vehicle width direction, the pair of power drive units are arranged between the pair of frame members in a plan view, and the heat sinks are attached individually to the lateral surfaces on the mutually opposed sides of the power drive units. With the above construction, the pair of power drive units can be compactly arranged in an area corresponding to the narrow space in the vehicle width direction between the pair of frame members.

Further, according to the sixth aspect of the embodiment, since the pair of power drive units are arranged between the horizontal planes extending through the upper ends and the lower ends of the driving units which include the electric motor and which are supported by the knuckle, the pair of power drive units can be arranged more compactly.

Obviously, numerous modifications and variations of the present invention are possible in light of the above teachings. It is therefore to be understood that within the scope of the appended claims, the invention may be practiced otherwise than as specifically described herein.

What is claimed is:

1. An electrically driven vehicle comprising:
    a first electric motor configured to generate motive power to operate a first driving wheel;
    a second electric motor configured to generate motive power to operate a second driving wheel;
    a first power drive device corresponding to the first electric motor and extending in a first direction;
    a second power drive device corresponding to the second electric motor and extending in the first direction;
    a first heat sink which has a plurality of first cooling fins extending in a second direction orthogonal to the first direction and which is attached to a first lateral surface of the first power drive device;
    a second heat sink which has a plurality of second cooling fins extending in the second direction and which is attached to a second lateral surface of the second power drive device, the second lateral surface being provided to face the first lateral surface;
    a baffle member including a first partition wall which is provided integrally with the baffle member and which is arranged between the first heat sink and the second heat sink, the baffle member closing a space defined between the first power drive device and the second power drive device at a first end and a second end of the space, the first end being opposite to the second end in the first direction;
    a first air guide passage which houses the first heat sink and in which cooling air is to flow in the second direction, the first air guide passage being provided between the first partition wall and the first power drive device; and
    a second air guide passage which houses the second heat sink and in which cooling air is to flow in the second direction, the second air guide passage being provided between the first partition wall and the second power drive device,
    wherein the first cooling fins and the second cooling fins are disposed within the first air guide passage and the second air guide passage, respectively, so as to face each other.

2. The electrically driven vehicle according to claim 1, further comprising:
    a cooling fan to blow the cooling air into the first air guide passage and the second air guide passage through an end of the first air guide passage and an end of the second air guide passage, the cooling fan being mounted on the baffle member.

3. The electrically driven vehicle according to claim 1, wherein the baffle member includes a second partition wall provided integrally with the baffle member such that an air passage provided independently of the first air guide passage and the second air guide passage is defined between the first partition wall and the second partition wall.

4. The electrically driven vehicle according to claim 1, further comprising:
    a vehicle body frame including
        a cabin structure,
        a left frame member extending backwardly from the cabin structure, and
        a right frame member extending backwardly from the cabin structure,
    wherein a first suspension arm extends outwardly so as to allow a left rear wheel as the first driving wheel to be suspended from the first suspension arm and being swingably supported on a first end of a rear wheel support frame which is fixedly secured to the left frame member and the right frame member to extend in a vehicle width direction,
    wherein a second suspension arm extends outwardly so as to allow a right rear wheel as the second driving wheel to be suspended from the second suspension arm and being swingably supported on a second end of the rear wheel support frame opposite to the first end of the rear wheel support frame in the vehicle width direction, and
    wherein the first power drive device and the second power drive device are arranged between the left frame member and the right frame member in a plan view of the electrically driven vehicle.

5. The electrically driven vehicle according to claim 1,
    wherein the baffle member includes a second partition wall provided integrally with the baffle member such that an air passage provided independently of the first air guide passage and the second air guide passage is defined between the first partition wall and the second partition wall, and
    wherein the second air guide passage is provided between the second partition wall and the second power drive device.

6. The electrically driven vehicle according to claim 1, wherein the second direction is substantially parallel to a height direction of the electrically driven vehicle.

7. The electrically driven vehicle according to claim 1, wherein the first and second air guide passages are substantially symmetrical.

8. The electrically driven vehicle according to claim 1, wherein the first air guide passage is configured to provide cooling air to the first cooling fins and the second air guide passage is configured to provide cooling air to the second cooling fins.

9. The electrically driven vehicle according to claim 2, wherein the cooling fan is mounted on a lower end of the baffle member so as to circulate the cooling air upwardly within the first air guide passage and the second air guide passage, the first air passage housing the first heat sink having the plurality of first cooling fins extending in an upward and downward direction, the second air guide passage housing the second heat sink having the plurality of second cooling fins extending in the upward and downward direction.

10. The electrically driven vehicle according to claim 3, wherein the first air guide passage is configured to provide cooling air to the first cooling fins and the second air guide passage is configured to provide cooling air to the second cooling fins, the air passage provided between the first and second air guide passages.

11. The electrically driven vehicle according to claim 6, wherein fins of the first cooling fins and the second cooling fins each extend a greater distance in the second direction than the first direction.

12. An electrically driven vehicle comprising:
a first electric motor configured to generate motive power to operate a first driving wheel;
a second electric motor configured to generate motive power to operate a second driving wheel;
a first power drive device corresponding to the first electric motor and extending in a first direction;
a second power drive device corresponding to the second electric motor and extending in the first direction;
a first heat sink which has a plurality of first cooling fins extending in a second direction orthogonal to the first direction and which is attached to a first lateral surface of the first power drive device;
a second heat sink which has a plurality of second cooling fins extending in the second direction and which is attached to a second lateral surface of the second power drive device, the second lateral surface being provided to face the first lateral surface;
a baffle member including a first partition wall which is provided integrally with the baffle member and which is arranged between the first heat sink and the second heat sink, the baffle member closing a space defined between the first power drive device and the second power drive device at a first end and a second end of the space, the first end being opposite to the second end in the first direction;
a first air guide passage which houses the first heat sink and in which cooling air is to flow in the second direction, the first air guide passage being provided between the first partition wall and the first power drive device;
a second air guide passage which houses the second heat sink and in which cooling air is to flow in the second direction, the second air guide passage being provided between the first partition wall and the second power drive device;
a vehicle body frame including
a cabin structure,
a left frame member extending backwardly from the cabin structure, and
a right frame member extending backwardly from the cabin structure,
wherein a first suspension arm extends outwardly so as to allow a left rear wheel as the first driving wheel to be suspended from the first suspension arm and being swingably supported on a first end of a rear wheel support frame which is fixedly secured to the left frame member and the right frame member to extend in a vehicle width direction;
a first driving device including the first electric motor and supported on a knuckle on which the rear wheel is pivotally supported; and
a second driving device including the second electric motor and supported on the knuckle on which the rear wheel is pivotally supported,
wherein a second suspension arm extends outwardly so as to allow a right rear wheel as the second driving wheel to be suspended from the second suspension arm and being swingably supported on a second end of the rear wheel support frame opposite to the first end of the rear wheel support frame in the vehicle width direction,
wherein the first power drive device and the second power drive device are arranged between the left frame member and the right frame member in a plan view of the electrically driven vehicle, and
wherein the first power drive device and the second power drive device are arranged between a first horizontal plane and a second horizontal plane, the first horizontal plane passing through an upper end of the first driving device and an upper end of the second driving device, the second horizontal plane passing through a lower end of the first driving device and a lower end of the second driving device.

* * * * *